US012506002B2

(12) United States Patent
Nakayama

(10) Patent No.: US 12,506,002 B2
(45) Date of Patent: Dec. 23, 2025

(54) METHOD OF MANUFACTURING SEMICONDUCTOR DEVICE USING PLASMA TO MODIFY SURFACE OF SILICON-CONTAINING FILMS EXPOSED IN TRENCH STRUCTURE, AND RECORDING MEDIUM

(71) Applicant: HITACHI KOKUSAI ELECTRIC INC., Tokyo (JP)

(72) Inventor: Masanori Nakayama, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 287 days.

(21) Appl. No.: 15/464,816

(22) Filed: Mar. 21, 2017

(65) Prior Publication Data

US 2017/0194135 A1    Jul. 6, 2017

Related U.S. Application Data

(63) Continuation of application No. PCT/JP2016/051818, filed on Jan. 22, 2016.

(30) Foreign Application Priority Data

Feb. 2, 2015    (JP) ................. 2015-018411

(51) Int. Cl.
*H01L 21/02* (2006.01)
*H01J 37/32* (2006.01)
*H01L 21/321* (2006.01)

(52) U.S. Cl.
CPC ...... *H01L 21/0234* (2013.01); *H01J 37/3211* (2013.01); *H01J 37/32155* (2013.01);
(Continued)

(58) Field of Classification Search
CPC ........... H01L 21/0234; H01L 21/32105; H01L 21/02326; H01L 21/02323;
(Continued)

(56) References Cited

U.S. PATENT DOCUMENTS 5,766,379 A    6/1998   Lanford et al.
8,318,554 B2 * 11/2012  Arai ............... H10D 30/6739
                                                   438/149
(Continued)

FOREIGN PATENT DOCUMENTS

JP    2009-252773 A    10/2009
JP    2014-075579 A     4/2014

OTHER PUBLICATIONS

The Japanese Office Action issued on Oct. 24, 2017 for the Japanese Application No. JP2016573279.
(Continued)

*Primary Examiner* — Joshua Benitez Rosario
*Assistant Examiner* — Scott E Bauman
(74) *Attorney, Agent, or Firm* — Volpe Koenig

(57) ABSTRACT

A method of manufacturing a semiconductor device includes providing a substrate processing apparatus including a substrate processing chamber having a plasma generation space and a substrate processing space, a coil provided on the plasma generation space and having an electrical length equal to an integer multiple of a wavelength of high frequency power, and a mounting table, mounting the substrate having a trench to the mounting table, the trench configured so that surfaces of silicon-containing films differing in type are exposed, while at least one of the silicon-containing films including surfaces differing in crystal orientation, supplying a process gas into the chamber, starting generation of plasma of the process gas by applying high frequency power to the coil, and modifying the surfaces by the plasma.

14 Claims, 14 Drawing Sheets

(52) U.S. Cl.
CPC .. *H01J 37/32926* (2013.01); *H01L 21/02236* (2013.01); *H01L 21/02238* (2013.01); *H01L 21/02252* (2013.01); *H01L 21/02323* (2013.01); *H01L 21/02326* (2013.01); *H01L 21/32105* (2013.01); *H01J 2237/332* (2013.01)

(58) Field of Classification Search
CPC ......... H01L 21/02252; H01L 21/02238; H01L 21/02236
See application file for complete search history.

(56) References Cited

U.S. PATENT DOCUMENTS

| | | | |
|---|---|---|---|
| 9,059,229 B2* | 6/2015 | Terasaki | H01J 37/321 |
| 9,728,551 B1* | 8/2017 | Lu | H01L 21/3003 |
| 2001/0054605 A1 | 12/2001 | Suzuki et al. | |
| 2002/0190748 A1* | 12/2002 | Sun | H03K 19/1778 |
| | | | 326/37 |
| 2003/0089935 A1* | 5/2003 | Fan | H01L 29/792 |
| | | | 257/296 |
| 2007/0298622 A1* | 12/2007 | Terasaki | H01J 37/32678 |
| | | | 438/770 |
| 2008/0076266 A1* | 3/2008 | Fukazawa | C23C 16/56 |
| | | | 257/E21.279 |
| 2008/0176413 A1* | 7/2008 | Sasaki | H01L 21/0223 |
| | | | 257/E21.24 |
| 2009/0170345 A1* | 7/2009 | Akae | H01L 21/3145 |
| | | | 438/786 |
| 2010/0319619 A1 | 12/2010 | Fujita et al. | |
| 2011/0189860 A1* | 8/2011 | Porshnev | H01L 21/02332 |
| | | | 438/785 |
| 2011/0250763 A1 | 10/2011 | Takahashi et al. | |
| 2011/0256726 A1 | 10/2011 | Lavoie et al. | |
| 2012/0068255 A1* | 3/2012 | Lee | H10B 43/27 |
| | | | 257/324 |
| 2012/0298039 A1 | 11/2012 | Peuse et al. | |
| 2013/0078789 A1* | 3/2013 | Nakayama | H01J 37/32697 |
| | | | 438/513 |
| 2013/0267098 A1 | 10/2013 | Maeda et al. | |
| 2013/0307052 A1* | 11/2013 | Jenne | H01L 21/02595 |
| | | | 257/325 |
| 2014/0106573 A1* | 4/2014 | Terasaki | H01J 37/3211 |
| | | | 438/771 |
| 2016/0163728 A1* | 6/2016 | Tsutsumi | H10B 41/35 |
| | | | 257/66 |
| 2017/0062454 A1* | 3/2017 | Lu | H10B 43/27 |
| 2017/0194135 A1* | 7/2017 | Nakayama | H01J 37/3211 |

OTHER PUBLICATIONS

International Search Report for WO 2016/125606 A1, Mar. 29, 2016.
Non-Final Office Action issued Sep. 15, 2014 for U.S. Appl. No. 14/024,249.

\* cited by examiner

Based on c-Si

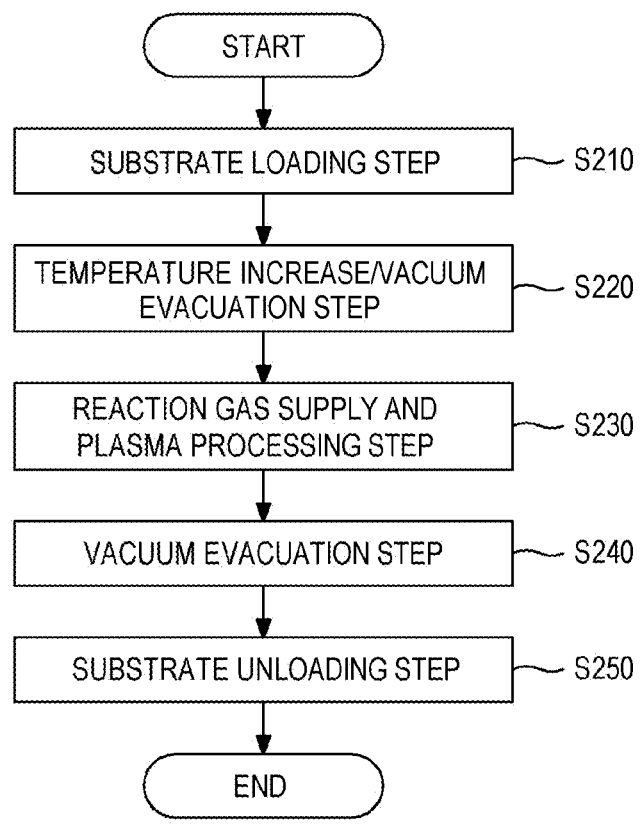

METHOD OF MANUFACTURING SEMICONDUCTOR DEVICE USING PLASMA TO MODIFY SURFACE OF SILICON-CONTAINING FILMS EXPOSED IN TRENCH STRUCTURE, AND RECORDING MEDIUM

CROSS-REFERENCE TO RELATED APPLICATIONS

This application is a Continuation Application of PCT International Application No. PCT/JP2016/051818, filed Jan. 22, 2016, which claimed the benefit of Japanese Patent Application No 2015-018411, filed on Feb. 2, 2015, the entire content of each of which is hereby incorporated by reference.

TECHNICAL FIELD

The present disclosure relates to a method of manufacturing a semiconductor device, and a recording medium.

BACKGROUND

In recent years, semiconductor devices such as flash memories or the like tend to be big fly integrated. Along with this, the size of patterns has been remarkably miniaturized. When forming these patterns, as one example of a manufacturing process, a predetermined process such as oxidation process or a nitriding process is often performed with respect to a substrate.

Along with the three-dimensional structuring of a semiconductor device, there is a need to perform a surface modification process such as oxidation and nitriding with good coverage in a groove (trench) having a high aspect ratio in which different bases exist. In order to meet this need, in the related art, a thermal radical oxidation treatment method, which is characterized by the low underlying substrate dependency, has been the mainstream. However, even with this method, the so-called micro loading effect in which coverage is changed along with the occurrence of the base dependency, the deterioration of the in-plane uniformity, the variation of the coverage characteristic in the substrate plane or the variation of the groove depth may be problematic.

A plasma deposition technique is also used to solve the problem, in which the film thickness varies depending on the base subjected to the modification process, or to improve the coverage of the modification process. However, in the plasma process of the related art, due to the low substrate processing temperature, there may be a case where the film characteristics are inferior to thermal process and the rate of oxidation is slow, thereby reducing the productivity. In addition, due to the high RF power required for plasma generation, the substrate may be damaged or particles may be generated as a result of etching of the interior of a reaction chamber.

SUMMARY

The present disclosure provides some embodiments of a technique capable of forming a diffused oxide film in a semiconductor device manufacturing process under a condition of good coverage and film quality without depending on a base to be subjected a modification process and capable of improving the characteristics and productivity of a semiconductor device.

According to one embodiment of the present disclosure, there is provided a technique, including:

providing a substrate processing apparatus including a substrate processing chamber having a plasma generation space where a supplied process gas is excited into plasma and a substrate processing space communicating with the plasma generation space and accommodating a substrate at the time of substrate processing, a coil provided on an outer periphery of the plasma generation space and having an electrical length equal to an integer multiple of a wavelength of high frequency power to be applied, and a substrate mounting table configured to mount the substrate in a position below a lower end of the coil;

mounting a substrate having a trench structure on a surface thereof to the substrate mounting table, the trench structure configured so that surfaces of silicon-containing films differing in type from each other are exposed in the trench structure, at least one of the silicon-containing films including surfaces differing in crystal orientation from each other;

supplying the process gas into the substrate processing chamber;

starting generation of plasma of the process gas in the plasma generation space by applying high frequency power to the coil; and modifying the surfaces of the silicon-containing films exposed in the trench structure of the substrate by the plasma.

BRIEF DESCRIPTION OF THE DRAWINGS

FIG. 12 is a flowchart showing the substrate processing process according to the second embodiment of the present disclosure.

DETAILED DESCRIPTION

Figure 1:
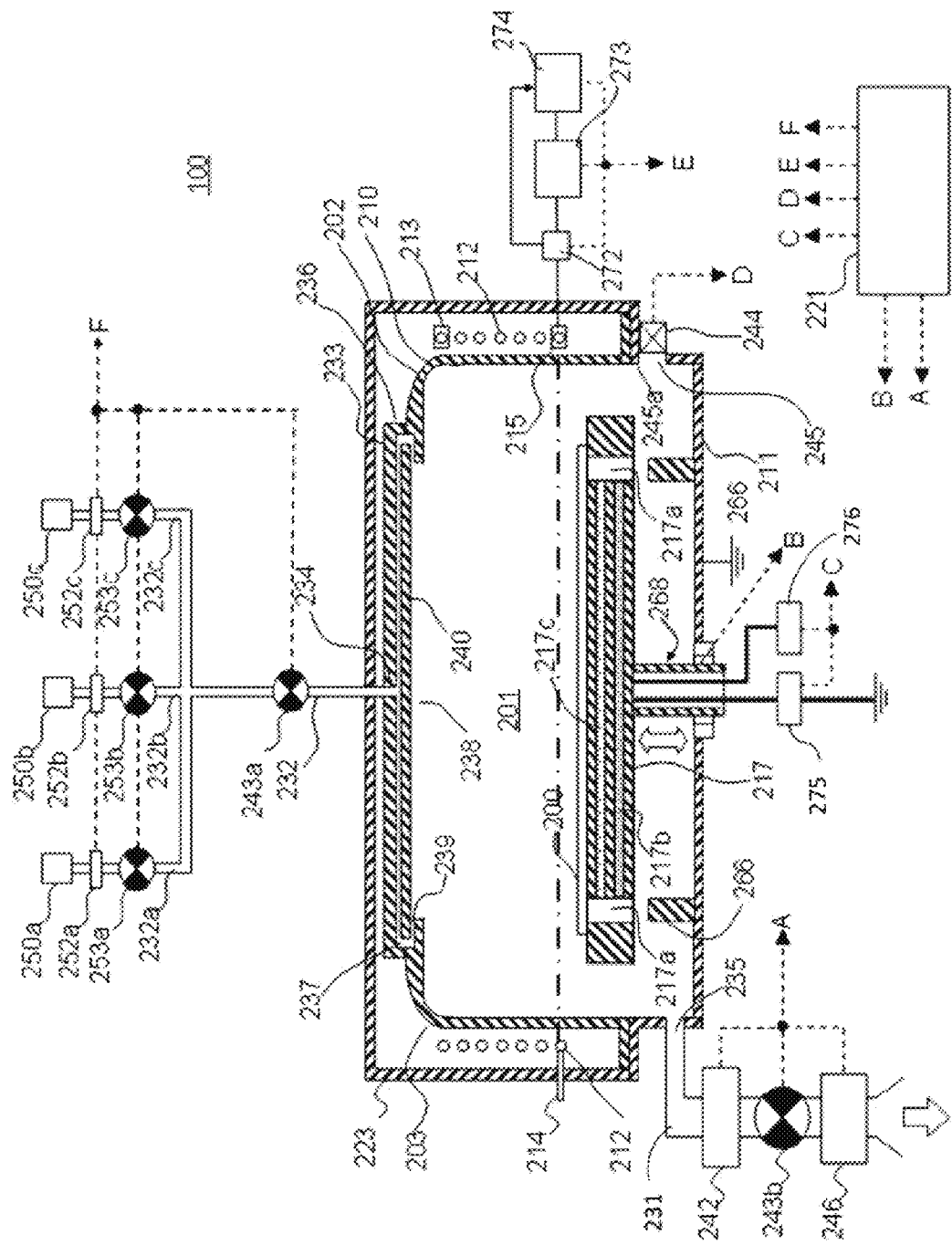
FIG. 1 is a sectional view of a substrate processing apparatus according to an embodiment of the present disclosure.

Embodiments of the present disclosure will now be described in detail with reference to the drawings.

First Embodiment of the Present Disclosure (1) Configuration of Substrate Processing Apparatus A substrate processing apparatus according to a first embodiment of the present disclosure will now be described with reference to FIGS. 1 to 5.
(Process Chamber)

A substrate processing apparatus 100 includes a processing furnace 202 configured to process a wafer 200 with plasma. The processing furnace 202 is provided with a process container 203 constituting a process chamber 201. The process container 203 includes a dome-shaped upper container 210, which is a first container, and a bowl-shaped lower container 211, which is a second container. By covering the lower container 211 with the upper container 210, the process chamber 201 is formed. The upper container 210 is made of a nonmetallic material such as, e.g., aluminum oxide ($Al_2O_3$) or quartz $SiO_2$). The lower container 211 is made of, e.g., aluminum (Al).

A gate valve 244 is provided on the lower side all of the lower container 211. When the gate valve 244 is opened, the wafer 200 may be loaded into the process chamber 201 via a loading/unloading gate 245 using a transfer mechanism (not shown). Alternatively, the wafer 200 may be unloaded to the outside of the process chamber 201 via the loading/unloading gate 245 using a transfer mechanism (not shown). When closed, the gate valve 244 serves as a partitioning valve that maintains airtightness of the interior of the process chamber 201.

The process chamber 201 includes a plasma generation space 201a around which a coil 212 is installed as will be described later, and a substrate processing space 201b communicating with the plasma generation space 201a and configured to process the wafer 200 therein. The plasma generation space 201a is a space in which plasma is generated. The plasma generation space 201a refers to a space defined inside the process chamber 201 and existing above the lower end (indicated by a one-dot chain line in FIG. 1) of the coil 212. On the other hand, the substrate processing space 201b is a space in which the substrate is processed with plasma. The substrate processing space 201b refers to a space existing below the lower end of the coil 212.
(Susceptor)

A susceptor 217 serving as a substrate mounting part on which the wafer 200 is mounted is disposed at the bottom-side center of the process chamber 201. The susceptor 217 is made of a nonmetallic material such as e.g., aluminum nitride (AlN), ceramics, quartz or the like. The susceptor 217 can reduce metal contamination of a film or the like formed on the wafer 200.

A heater 217b as a heating mechanism is integrally embedded in the susceptor 217. The heater 217b is configured to be able to heat the surface of the wafer 200, for example, from 25 degrees C. to 700 degrees C. when electric power is supplied to the heater 217b via a heater power adjustment mechanism 276.

The susceptor 217 is electrically insulated from the lower container 211. An impedance adjustment electrode 217c is provided inside the susceptor 217. The impedance adjustment electrode 217c is grounded via an impedance varying mechanism 275 as an impedance adjustment part. The impedance varying mechanism 275 is composed of a coil and a variable capacitor. The impedance varying mechanism 275 is configured to be able to change impedance from about 0Ω within a range of a parasitic impedance value of the process chamber 201 by controlling the inductance and resistance of the coil and the capacitance value of the variable capacitor. Thus, the potential (bias voltage) of the wafer 200 can be controlled via the impedance adjustment electrode 217c and the susceptor 217.

In the susceptor 217, there is installed a susceptor elevating mechanism 268 for raising and lowering the susceptor 217. Through-holes 217a are formed in the susceptor 217. Wafer push-up pins 266 are provided on the bottom surface of the lower container 211. The through-holes 217a and the wafer push-up pins 266 are provided in at least three positions so as to face each other. When the susceptor 217 is lowered by the susceptor elevating mechanism 268, the wafer push-up pins 266 penetrate the through-hole 217a in a state in which the wafer push-up pins 266 do not make contact with the susceptor 217.

A substrate mounting part according to the present embodiment is mainly configured by the susceptor 217, the heater 217b and the impedance adjustment electrode 217c.
(Gas Supply Part)

A gas supply head 236 is provided above the process chamber 201, namely on the upper portion of the upper container 210. The gas supply head 236 has a cap-like lid 233, a gas introduction port 234, a buffer chamber 237, an opening 238, a shield plate 240 and a gas discharge port 239. The gas supply head 236 is configured to be able to introduce a reaction gas into the process chamber 201. The buffer chamber 237 functions as a dispersion space for dispersing the reaction gas introduced from the gas introduction port 234.

A downstream end of a gas supply pipe 232a for supplying an oxygen ($O_2$) gas as an oxygen-containing gas, a downstream end of a gas supply pipe 232b for supplying a hydrogen ($H_2$) gas as a hydrogen-containing gas, and a gas supply pipe 232c for supplying an argon (Ar) gas as an inert gas are connected and joined to the gas introduction port 234. In the gas supply pipe 232a, an $O_2$ gas supply source 250a, a mass flow controller (MFC) 252a as a flow rate control device, and a valve 253a as an opening/closing valve are installed sequentially from the upstream side. In the gas supply pipe 232b, an $H_2$ gas supply source 250b, an MFC 252b as a flow rate control device, and a valve 253b as an opening/closing valve are installed sequentially from the upstream side. In the gas supply pipe 232c, an Ar gas supply source 250c, an MFC 252c as a flow rate control device, and a valve 253c as an opening/closing valve are installed sequentially from the upstream side. A valve 243a is installed on the downstream side of the position where the gas supply pipe 232a, the gas supply pipe 232b and the supply pipe 232c are merged. The valve 243a is connected to the upstream end of the gas introduction port 234. By opening and closing the valves 253a, 253b, 253c and 243a, the reaction gases such the oxygen-containing gas, the hydrogen-containing gas, the inert gas and the like may be supplied into the process chamber 201 while controlling the flow rates of the respective reaction gases with the MFCs 252a, 252b and 252c.

A gas supply part according to the present embodiment is mainly configured by the gas supply head 236 (the lid 233, the gas introduction port 234, the buffer chamber 237, the opening 238, the shield plate 240 and the gas discharge port 239), the gas supply pipes 232a, 232b and 232c, the MFC 252a, 252b and 252c, and the valve 253a, 253b, 253c and 243a.

An oxygen-containing gas supply system according to the present embodiment is configured by the gas supply head 236 (the lid 233, the gas introduction port 234, the buffer chamber 237, the opening 238, the shield plate 240 and the gas discharge port 239), the gas supply pipe 232a, the MFC 252a, and the valves 253a and 241a.

A hydrogen-containing gas supply system according to the present embodiment is configured by the gas supply head 236 (the lid 233, the gas introduction port 234, the buffer chamber 237, the opening 238, the shield plate 240 and the gas discharge port 239), the gas supply pipe 232b, the MFC 252b, and the valves 253b and 243a.

An inert gas supply system according to the present embodiment is configured by the gas supply head 236 (the lid 233, the gas introduction port 234, the buffer chamber 237, the opening 238, the shield plate 240 and the gas discharge port 239), the gas supply pipe 232c, the MFC 252c, and the valves 253c and 243a.

The gas supply part may include the $O_2$ gas supply source 250a, the $H_2$ gas supply source 250b and the Ar gas supply source 250c. The oxygen-containing gas supply system may include the $O_2$ gas supply source 250a. The hydrogen-containing gas supply system may include the $H_2$ gas supply source 250b. The inert gas supply system may include the Ar gas supply source 250c.

(Exhaust Part)

On the side-wall of the lower container 211, there is provided an exhaust port 235 for exhausting the reaction gases from the interior of the process chamber 201. An upstream end of an exhaust pipe 231 is connected to the exhaust port 235. In the exhaust pipe 231, an APC (Auto Pressure Controller) valve 242 as a pressure regulator (pressure regulation part), a valve 243b as an opening/closing valve, and a vacuum pump 246 as a vacuum exhaust device are installed sequentially from the upstream side.

An exhaust part according to the present embodiment is mainly configured by the exhaust port 235, the exhaust pipe 231, the APC valve 242 and the valve 243b. The vacuum pump 246 may be included in the exhaust part.

(Plasma Generation Part)

A spiral resonance coil 212 as a first electrode is provided on the outer peripheral portion of the process chamber 201, namely on the outer side of the sidewall of the upper container 210, so as to surround the process chamber 201. An RF sensor 272, a high-frequency power supply 273 and a frequency matcher 274 are connected to the resonance coil 212.

The high-frequency power supply 273 is configured to supply high-frequency power to the resonance coil 212. The RF sensor 272 is provided on the output side of the high frequency power supply 273. The RF sensor 272 is configured to monitor information on a traveling wave and a reflected wave of the supplied high-frequency power. The frequency matcher 274 is configured to control the high-frequency power supply 273 based on the information on the reflected wave monitored by the RF sensor 272, so as to minimize the reflected wave.

Since the resonance coil 212 forms a standing wave of a predetermined wavelength, the winding diameter, the winding pitch and the number of turns of the resonance coil 212 are set so that the resonance coil 212 can resonate in a constant wavelength mode. That is to say, the electrical length of the resonance coil 212 is set to a length corresponding to an integer multiple (1 times, 2 times, etc.) of one wavelength of a predetermined frequency of the electric power supplied from the high-frequency power supply 273. For example, in the case of 13.56 MHz, the length of one wavelength is about 22 meters. In the case of 27.12 MHz, the length of one wavelength is about 11 meters, in the case of 54.24 MHz, the length of one wavelength is about 5.5 meters. The resonance coil 212 is supported by a plurality of supports formed in a flat plate shape with an insulating material and vertically installed on the upper end surface of a base plate.

Both ends of the resonance coil 212 are electrically grounded. At least one end of the resonance coil 212 is grounded via a movable tap 213 in order to finely adjust the electrical length of the resonance coil 212 at the time of initial installation of the apparatus or at the time of changing the processing conditions. Reference numeral 214 in FIG. 1 indicates the other fixed ground. In order to finely adjust the impedance of the resonance coil 212 at the time of initial installation of the apparatus or at the time of changing the processing conditions, a power feeding part is formed by a movable tap 215 between the grounded ends of the resonance coil 212.

That is to say, the resonance coil 212 is provided with electrically grounded ground portions at both ends thereof and is provided with a power feeding portion, to which electrical power is supplied from the high-frequency power supply 273, between the respective ground portions. In addition, at least one of the ground portions is a position-adjustable variable ground portion and the power feeding portion is a position-adjustable variable power feeding portion. When the resonance coil 212 is provided with the variable ground portion and the variable power feeding portion, it is possible to more easily adjust the resonance frequency and load impedance of the process chamber 201 as will be described later. The principle of plasma generation will be described later.

The shield plate 223 is provided to shield the leakage of electromagnetic waves to the outside of the resonance coil 212 and to form a capacitance component for the construction of a resonance circuit between the shield plate 240 and the resonance coil 212. In general, the shield plate 223 is formed in a cylindrical shape using a conductive material such as aluminum alloy, copper, copper alloy or the like. The shield plate 223 is disposed at a distance of, for example, about 5 to 150 mm, from the outer periphery of the resonance coil 212.

The RF sensor 272 is installed on the output side of the high-frequency power supply 273 to monitor a traveling wave, a reflected wave or the like. The reflected wave power monitored by the RF sensor 272 is inputted to the frequency matcher (frequency control part) 274. The frequency matcher 274 controls a frequency so as to minimize the reflected wave.

A plasma generation part according to the present embodiment is mainly configured by the resonance coil 212, the RF sensor 272 and the frequency matcher 274. The high-frequency power supply 273 may be included in the plasma generation part.

Figure 2:
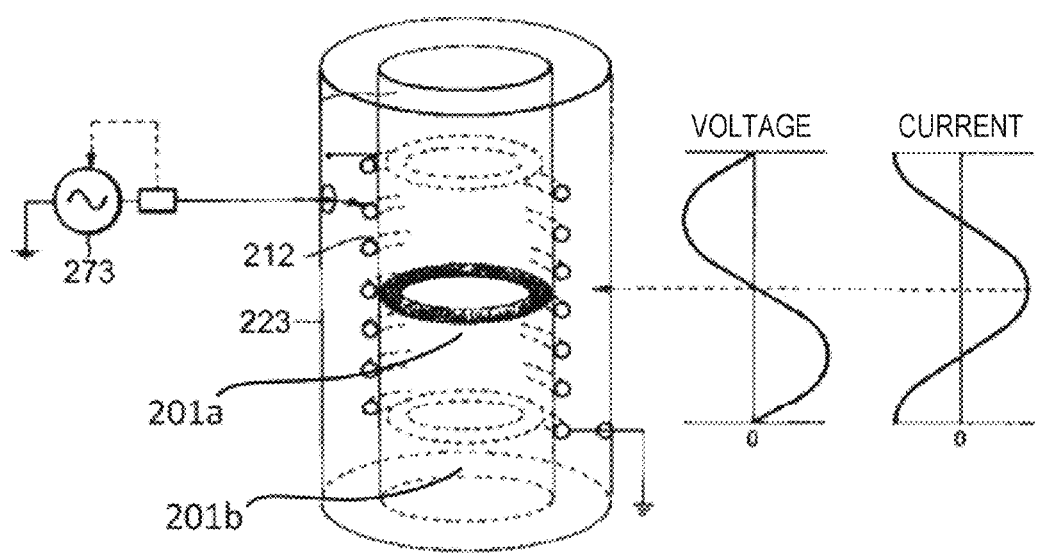
FIG. 2 is an explanatory diagram for explaining a plasma generation principle in the substrate processing apparatus according to an embodiment of the present disclosure.

The plasma generation principle of the apparatus according to the present embodiment and the properties of the plasma thus generated will now be described with reference to FIG. 2.

Since the resonance coil 212 forms a standing wave of a predetermined wavelength, the winding diameter, the winding pitch, and the number of turns of the resonance coil 212 are set so that the resonance coil 212 can resonate in a full wavelength mode. That is to say, the electrical length of the resonance coil 212 is set to an integer multiple (1 times, 2 times, etc.) of one wavelength of a predetermined frequency of the electric power applied from the high-frequency power supply 273.

Specifically, in view of the electric power to be applied, the intensity of the magnetic field to be generated, the external form of the apparatus to be applied, and the like, the resonance coil 212 is configured to have, for example, an effective cross-sectional area of 50 mm$^2$ to 300 mm$^2$ and a coil diameter of 200 mm to 500 mm so that a magnetic field of about 0.01 Gauss to about 10 Gauss can be generated by a frequency of 800 kHz to 50 MHz and a high-frequency power of 0.5 kW or more and 5 kW or less, in some embodiments, 1.0 kW or more and 4.0 kW or less. The resonance coil 212 is wound by about 2 to 60 turns around the outer periphery side of a room forming the plasma generation space 201a. As a material of which the resonance coil 212 is made, it may be possible to use, for example, a copper pipe, a thin copper plate, an aluminum pipe, a thin aluminum plate, a material obtained by vapor-depositing copper or aluminum on a polymer belt, or the like.

One end or both ends of the resonance coil 212 is normally grounded via a movable tap in order to finely adjust the electrical length of the resonance coil 212 at the time of installation and to make the resonance characteristic substantially equal to that of the high-frequency power supply 273. A waveform adjustment circuit including a coil and a shield is inserted at one end (or the other end or both ends) of the resonance coil 212 so that a phase current and an opposite phase current can flow symmetrically with respect to the electric midpoint of the resonance coil 212. The waveform adjustment circuit is configured as an open circuit by electrically disconnecting the end portion of the resonance coil 212 or by setting the end portion of the resonance coil 212 to an electrically equivalent state. Alternatively, the end portion of the resonance coil 212 may be ungrounded by a choke series resistance and may be DC-connected to a fixed reference potential.

Usually, the shield plate 223 is grounded so that the potential thereof is equal to that of both ends of the resonance coil 212. However, in order to accurately set the resonance number of the resonance coil 212, one end or both ends of the shield plate 223 is configured so that the tap position can be adjusted. Alternatively, in order to accurately set the resonance number, a trimming capacitance may be inserted between the resonance coil 212 and the shield plate 223.

The high-frequency power supply 273 includes a power supply control part (control circuit) including a high-frequency oscillation circuit and a preamplifier for defining the oscillation frequency and the output, and an amplifier (output circuit) for amplifying an input to a predetermined output. The power supply control part controls the amplifier based on the output conditions relating to the frequency and power set in advance through an operation panel. The amplifier supplies constant high-frequency power to the resonance coil 212 via a transmission line.

Incidentally, the plasma generation circuit configured by the resonance coil 212 is composed of a parallel resonance circuit of RLC. When the wavelength of the high-frequency power supply 273 and the electrical length of the resonance coil 212 are equal to each other, the resonance condition of the resonance coil 212 is set such that the reactance component generated by the capacitive component or inductive component of the resonance coil 212 is cancelled so as to become a pure resistance. However, in the plasma generation circuit described above, when plasma is generated, the actual resonance frequency varies slightly due to the fluctuation of the capacitive coupling between the voltage portion of the resonance coil 212 and the plasma or the fluctuation of the inductive coupling between the plasma generation space 201a and the plasma, or depending on the excited state of the plasma.

Thus, in the present embodiment, in order to make sure that the deviation of resonance in the resonance coil 212 at the time of plasma generation is compensated on the power supply side, the frequency matcher 274 has a function of detecting the reflected wave power supplied from the resonance coil 212 at the time of generation of plasma and complementing the output. With such a configuration, in the resonance device of the present disclosure, it is possible to more accurately form a standing wave by maintaining the resonance state in the resonance coil 212 and to generate plasma with an extremely small capacitive coupling.

That is to say, the frequency matcher 274 detects the reflected wave power supplied from the resonance coil 242 at the time of generation of plasma and increases or decreases an oscillation frequency with respect to a preset frequency so that the reflected wave power is minimized. Specifically, the frequency matcher 274 includes a frequency control circuit configured to correct a preset oscillation frequency. The RF sensor 272 (reflected wave power meter) for detecting the reflected wave power in a transmission line and feeding back the voltage signal thereof to the frequency control circuit is installed on the output side of the amplifier of the high-frequency power supply 273.

The frequency control circuit includes an A/D converter configured to receive the voltage signal from the RF sensor 272 and digital-convert the voltage signal into a frequency signal, an arithmetic processing circuit configured to perform an addition/subtraction process with respect to a value of a frequency signal corresponding to the converted reflected wave and a value of a pre-stored oscillation frequency, a D/A converter configured to analog-convert the value of the frequency obtained by the addition/subtraction process to a voltage signal, and a voltage control oscillator configured to oscillate according to the voltage applied from the D/A converter. Accordingly, the frequency control circuit oscillates at a load-free resonance frequency of the resonance coil 212 before the plasma is ignited and oscillates at a frequency, which is obtained by increasing or decreasing the preset frequency so that the reflected wave power is minimized, after the plasma is ignited. As a result, the frequency control circuit applies a frequency signal to the high-frequency power supply 273 so that the reflected wave on the transmission line becomes zero.

In other words, the frequency matcher 274 attached to the high-frequency power supply 273 compensates for the deviation of the resonance point in the resonance coil 212 due to the fluctuation of the capacitive coupling or inductive coupling of the generated plasma on the side of the high-frequency power supply 273. That is to say, the RF sensor 272 detects the reflected wave power attributable to the fluctuation of the capacitive coupling or inductive coupling of the plasma. The frequency matcher 274 increases or decreases the preset frequency by an amount corresponding to the deviation of the resonance frequency, which is a cause of generation of the reflected wave power, so as to minimize the detected reflected wave power. The frequency matcher 274 outputs the high frequency, which is the resonance frequency of the resonance coil 212 under a plasma condition, to the amplifier of the high-frequency power supply 273.

In the present embodiment, after reducing the internal pressure of the plasma generation space 201a to, for example, a pressure which falls within a range of 0.01 Torr or more and 50 Torr or less, a plasma generation gas (in the present embodiment, an oxygen-containing gas) is supplied into the plasma generation space 201a while maintaining the above vacuum degree. If a high frequency power of, for example, 27.12 MHz and 2 kW, is supplied from the high-frequency power supply 273 to the resonance coil 212, an inductive electric field is generated inside the plasma generation space 201a. As a result, the supplied gas is plasma-excited into a plasma state in the plasma generation space 201a.

In other words, in the resonance device of the present disclosure, the high frequency having an accurately resonating frequency is outputted in accordance with the deviation of the resonance point of the resonance coil 212 at the time of plasma generation and at the time of variation of the plasma generation condition. It is therefore possible for the resonance coil 212 to more accurately form a standing wave. That is to say, as shown in FIG. 2, in the resonance coil 212, the standing wave having a state in which the phase voltage and the opposite phase voltage are always canceled out is formed by the transmission of the actual resonance frequency of the resonator including the plasma. The highest phase current is generated at the electrical midpoint of the coil (at the node with a zero voltage). Accordingly, the inductive plasma excited at the electric midpoint has almost no capacitive coupling with the wall of the process chamber or the substrate mounting table. Doughnut-shaped plasma with extremely low electric potential can be formed in the plasma generation space 201a.

(Control Part)

Figure 3:
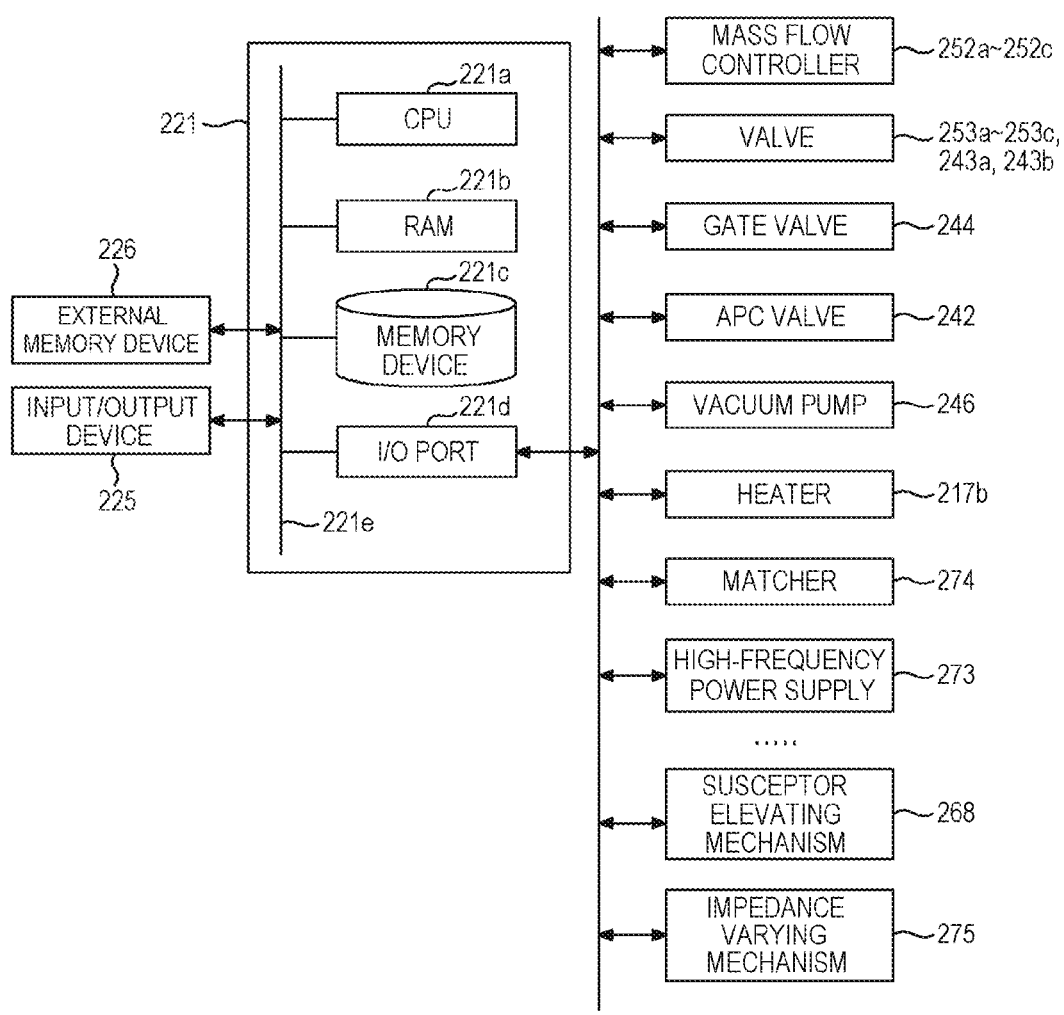
FIG. 3 is a view illustrating a control device according to an embodiment of the present disclosure.

As shown in FIG. 3, a controller 221 as a control part is configured as a computer including a CPU (Central Processing Unit) 221a, a RAM (Random Access Memory) 221b, memory device 221c and an I/O port 221d. The RAM 221b, the memory device 221c and the I/O port 221d are configured to be able to exchange data with the CPU 221a via an internal bus 221e. For example, a touch panel, a mouse, a keyboard, an operation terminal or the like as an input/output device 225 may be connected to the controller 221. In addition, for example, a display or the like as a display part may be connected to the controller 221.

The memory device 221c is composed of, for example, a flash memory, an HDD (Hard Disk Drive), a CD-ROM or the like. In the memory device 221c, a control program for controlling the operation of the substrate processing apparatus 100, a process recipe in which substrate processing procedures, substrate processing conditions and the like are written, and the like are readably stored. The process recipe functions as a program for causing the controller 221 to execute each sequence in the substrate processing process to be described later, so as to obtain a predetermined result. Hereinafter, the process recipe and the control program will be generally and simply referred to as a "program". When the term "program" is used herein, it may indicate a case of including only the process recipe, a case of including only the control program, or a case of including both the process recipe and the control program. The RAM 221b is configured as a memory area (work area) in which a program or data read by the CPU 221a is temporarily stored.

The I/O port 221d is connected to the MFCs 252a to 252c, the valves 253a to 253c, 243a and 243b, the gate valve 244, the APC valve 242, the vacuum pump 246, the heater 217b, the RF sensor 272, the high-frequency power supply 273, the frequency matcher 274, the susceptor elevating mechanism 268, an impedance varying mechanism 275, and the like.

The CPU 221a is configured to read the control program from the memory device 221c and execute the same. The CPU 221a is also configured to read the process recipe from the memory device 221c according to an input of an operation command from the input/output device 225. In addition, as shown in FIG. 1, the CPU 221a is configured to control, according to the contents of the process recipe thus read, the opening degree adjustment operation of the APC valve 242, the opening/closing operation of the valve 243b, and the startup and stop of the vacuum pump 246 through the I/O port 221d and a signal line A. The CPU 221a is also configured to control the elevating operation of the susceptor elevating mechanism 268 through a signal line B. The CPU 221a is also configured to control, through a signal line C, the supply power adjustment operation (temperature adjustment operation) with respect to the heater 217b performed by a heater power adjustment mechanism 276 based on a temperature sensor and the impedance value adjustment operation performed by the impedance varying mechanism 275. The CPU 221a is also configured to control the opening/closing operation of the gate valve 244 through a signal line D. The CPU 221a is also configured to control the operations of the RF sensor 272, the frequency matcher 274 and the high-frequency power supply 273 through a signal line E. The CPU 221a is also configured to control, through a signal line F, the flow rate adjustment of various gases performed by the MFCs 252a to 252c. and the opening/closing operations of the valves 253a to 253c and 243a.

The controller 221 is not limited to being configured as a dedicated computer but may be configured as a general-purpose computer. For example, the controller 221 according to the present disclosure may be configured by preparing an external memory device (for example, a magnetic tape, a magnetic disk such as a flexible disk or a hard disk, an optical disk such as a CD or a DVD, a magneto-optical disk such as an MO, or a semiconductor memory such as a USB memory or a memory card) 226, which stores the aforementioned program, and installing the program in a general-purpose computer using the external memory device 226. The means for supplying the program to the computer is not limited to the case of supplying the program via the external memory device 226. For example, the program may be supplied to the computer using a communication means such as the Internet or a dedicated line, instead of using the external memory device 226. The memory device 221c or the external memory device 226 is configured as a non-transitory computer-readable recording medium. Hereinafter, the memory device 221c and the external memory device 226 will be generally and simply referred to as a "recording medium." When the term "recording medium" is used herein, it may indicate a case of including only the memory device 221c, a case of including only the external memory device 226, or a case of including both the memory device 221c and the external memory device 226.

(Substrate Processing Process)

Next, the substrate processing process according to the present embodiment will be described mainly with reference to FIG. 4. The substrate processing process according to the present embodiment is performed by the above-described substrate processing apparatus 100 as one of the processes for manufacturing a semiconductor device such as, e.g., a flash memory or the like. In the following description, the operations of the respective parts constituting the substrate processing apparatus 100 are controlled by the controller 221.

Figure 5:
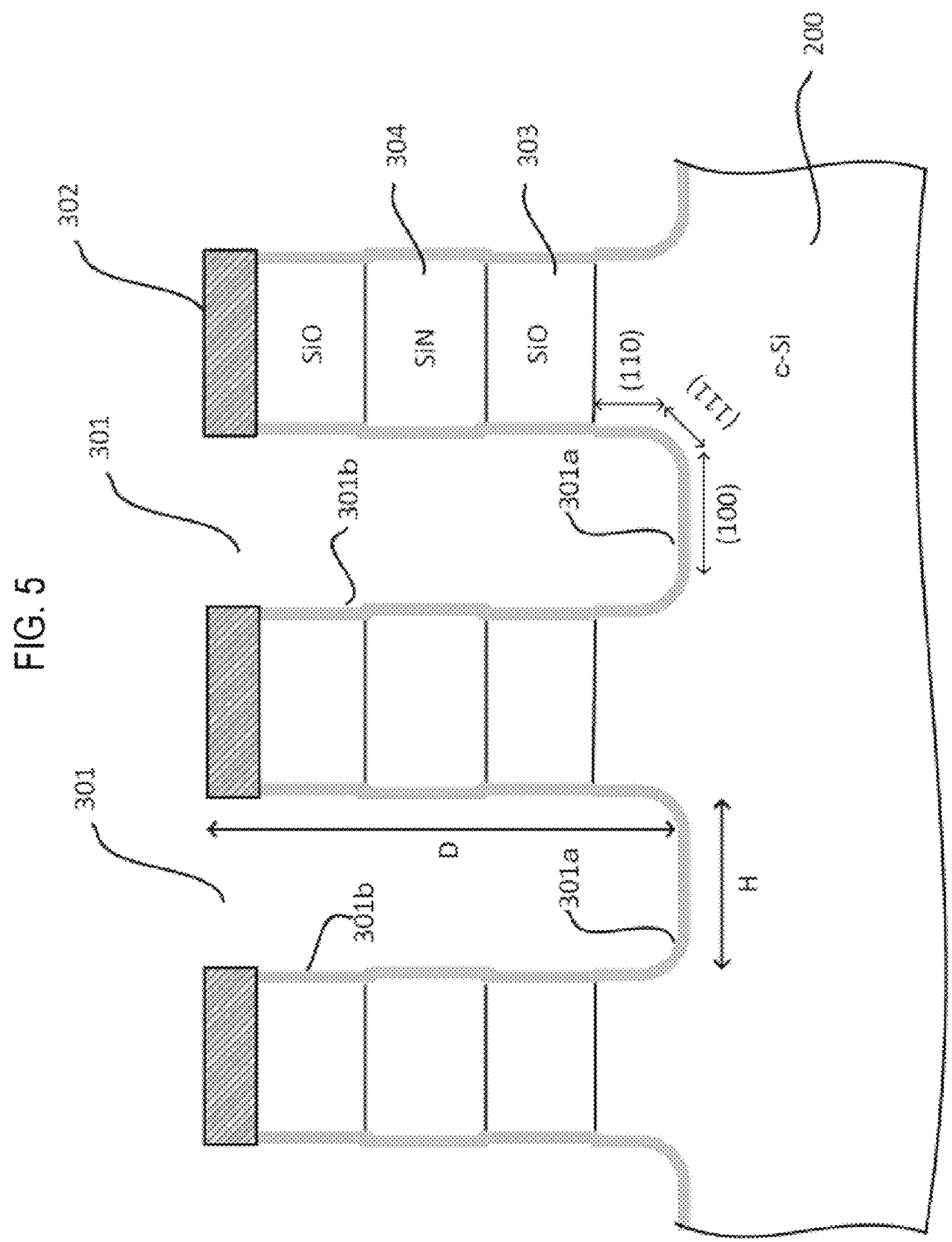
FIG. 5 is a view illustrating a pattern structure of a substrate processed in the substrate processing process according to the first embodiment of the present disclosure.

On the surface of the wafer 200 processed in the substrate processing process according to the present embodiment, for example, as shown in FIG. 5, a trench 301 of a high aspect ratio having uneven portions (grooves) is formed in advance. The trench 301 is formed, for example, by stacking plural types of silicon-containing films on the wafer 200, forming a mask layer 302 having a predetermined pattern thereon, and etching the surface of the wafer 200 to a predetermined depth. In the formed trench 301, plural types of silicon-containing films differing in type from one another are exposed. In the vicinity of the bottom surface of the trench 301, silicon-containing films having mutually different crystal orientations are exposed. The expression "high aspect ratio" used herein means that D/H is about 20 where D is the depth of the trench and H is the width thereof.

On the wafer 200 of the present embodiment, different types of silicon-containing films, for example, a silicon oxide film 303 and a silicon nitride film 304 are stacked on monocrystalline silicon (c-Si). c-Si having different crystal orientations are exposed in the vicinity of the boundary between the bottom portion 301a and the side portion 301b of the trench 301 formed in c-Si. In this example, the crystal orientation of the bottom portion 301a is (100), the crystal orientation in the boundary portion is (111), and the crystal, orientation in the side portion 301b is (110). In this embodiment, a silicon oxide film and a silicon nitride film are stacked as the silicon-containing films. Alternatively, silicon-containing films such as a polysilicon (Poly-Si), a P-type doped silicon (B-dope c-Si), an N-type doped silicon (p-dope c-Si) and the like may be stacked.

In the present embodiment, an oxidation treatment (diffusion oxidation) is performed on the inner wall (the side portion, the bottom portion and the boundary portion) of the trench 301. At that time, the processing apparatus is controlled so as to improve the step coverage which is the ratio of the thickness of the oxide film of the bottom portion 301a of the trench 301 to the thickness of the oxide film of the side portion 301b of the trench 301. Descriptions will be made in detail below.

(Substrate Loading Step S110)

First, the wafer 200 is loaded into the process chamber 201. More specifically, the susceptor elevating mechanism 268 lowers the susceptor 217 to the transfer position of the wafer 200, whereby the wafer push-up pins 266 are caused to penetrate the through-holes 217a of the susceptor 217. As a result, the water push-up pins 266 protrude by a predetermined height from the surface of the susceptor 217.

Subsequently, the gate valve 244 is opened, and the wafer 200 is loaded into the process chamber 201 from a vacuum transfer chamber (not shown) adjacent to the process chamber 201 by a transfer mechanism not shown in the figure. As a result, the wafer 200 is supported horizontally on the wafer push-up pins 266 protruding from the surface of the susceptor 217. After loading the wafer 200 into the process chamber 201, the transfer mechanism is withdrawn to the outside of the process chamber 201 and the gate valve 244 is closed to tightly seal the interior of the process chamber 201. Then, the susceptor elevating mechanism 26 raises the susceptor 217 to a predetermined position between the lower end 203a of the resonance coil 212 and the upper end 245a of the loading/unloading gate 245. As a result, the wafer 200 is supported on the upper surface of the susceptor 217. The substrate loading step S110 may be performed while purging the inside of the process chamber 201 with an inert gas or the like.

(Temperature Increase Vacuum Evacuation Step S120)

Subsequently, the temperature of the wafer 200 loaded into the process chamber 201 is increased. The heater 217b is heated in advance. By keeping the loaded water 200 held on the susceptor 217 in which the heater 217b is embedded, the wafer 200 is heated to a predetermined value which falls within a range of, for example, 150 degrees C. to 650 degrees C. In the present embodiment, heating is performed so that the temperature of the wafer 200 becomes 600 degrees C. While increasing the temperature of the wafer 200, the interior of the process chamber 201 is evacuated by the vacuum pump 246 via die exhaust pipe 231 so that the internal pressure of the process chamber 201 becomes a predetermined value which falls within a range of 0.1 Pa to 1000 Pa. For example, the internal pressure of the process chamber 201 is regulated to 200 Pa. The vacuum pump 246 is operated at least until the substrate unloading step S160 to be described later is completed.

(Process Gas Supply Step S130)

Next, the supply of an $O_2$ gas as a process gas (reaction gas) is started. Specifically, the valve 253a is opened, and the supply of an $O_2$ gas into the process chamber 201 via the buffer chamber 237 is started while controlling the flow rate of the $O_2$ gas by the MFC 252a. At this time, the flow rate of the $O_2$ gas is set to a predetermined value which fills within a range of, for example, 100 sccm or more and 1000 seem or less. Furthermore, the interior of the process chamber 201 is evacuated by adjusting the opening degree of the APC valve 242 so that the internal pressure of the process chamber 201 becomes a predetermined pressure which falls within a range of, for example, 1 Pa to 1000 Pa, more preferably 100 Pa to 200 Pa. While appropriately evacuating the inside of the process chamber 201 in this manner, the supply of the $O_2$ gas is continued until the end of the plasma processing step S140 to be described later. In this step, the $O_2$ gas is used as an example of the process gas. Alternatively, a mixed gas of an $O_2$ gas and a $H_2$ gas may be used, or an Ar gas or a $N_2$ gas may be mixed as an additional gas.

(Plasma Processing Step (Modification Processing Step) S140)

After the internal pressure of the process chamber 201 is stabilized, the application of the high frequency power to the resonance coil 212 from the high-frequency power supply 273 via the RF sensor 272 is started.

As a result, an inductive magnetic field is formed in the plasma generation space 201a. The $O_2$ gas supplied to the plasma generation space 201a is plasma-excited by the inductive magnetic field. Doughnut-like inductive plasma is excited in a height position corresponding to the electric midpoint of the resonance coil 212 in the plasma generation space 201a. The $O_2$ gas is dissociated by the plasma to generate reactive species such as oxygen active species containing oxygen (O), oxygen ions, or the like. These reactive species act on the silicon-containing films to oxidize (modify) the films.

As described above, the standing wave having a state in which a phase voltage and an opposite phase voltage are always canceled out is formed. The highest phase current is generated at the electric midpoint of the coil (at the node having zero voltage). Accordingly, the inductive plasma excited at the electric midpoint has almost no capacitive coupling with the wall of the process chamber or the substrate mounting table. Doughnut-shaped plasma with extremely low electric potential can be formed in the plasma generation space 201a.

Furthermore, as described above, the power supply control part attached to the high-frequency power supply 273 compensates for the deviation of the resonance point in the resonance coil 212 due to the fluctuation of the capacitive coupling or inductive coupling of the plasma, thereby more accurately forming the standing wave. Thus, there is almost no capacitive coupling. This makes it possible to more accurately form the plasma with extremely low electric potential in the plasma generation space.

Since the plasma having extremely low electrical potential is generated, it is possible to prevent occurrence of a sheath on the wall of the plasma generation space 201a or on the substrate mounting table. Therefore, ions in the plasma are not accelerated.

In the trench 301 of the wafer 200 held on the substrate mounting table 217 in the substrate processing space 201b, two or more kinds of silicon-containing films different from each other are exposed. At least one of these silicon-containing films exposes the surfaces having a plurality of mutually different crystal orientations, for example, near the bottom surface of the groove. Radicals in the mixed gas and ions in a non-accelerated state are uniformly supplied into the trench 301. The radicals and ions thus supplied uniformly react with the bottom portion 301a, the side portion 301b and the boundary portion thereof to modify the silicon-containing films into an oxide film with high step coverage. Since ion attack due to acceleration can be prevented, it is possible to suppress wafer damage which may be caused by ions. By the modification treatment performed in the present embodiment, the surfaces of the silicon-containing films are oxidized to form an oxide film such as, for example, an $SiO_2$ film or the like.

Inasmuch as the acceleration of ions is prevented, there is no sputtering action on the peripheral wall of the plasma generation space and there is no damage to the peripheral wall of the plasma generation space. As a result, it is possible to prolong the lifespan of the apparatus. It is also possible to prevent a problem that the member component of the plasma generation space or the like enters the plasma and contaminates the wafer.

Since the power supply control part attached to the high-frequency power supply 273 compensates for the reflected wave power due to the impedance mismatch generated in the resonance coil 212 on the side of the high-frequency power supply 273 and compensates for the reduction in effective load power, it is possible to reliably supply the high-frequency power of an initial level to the resonance coil 212 at all times and to stabilize the plasma. Accordingly, the wafer held in the substrate processing space can be uniformly processed at a constant rate.

Thereafter, when a predetermined processing time of, for example, 10 seconds to 300 seconds elapses, the output of the electric power from the high-frequency power supply 273 is stopped to thereby stop the plasma discharge in the process chamber 201. The valve 253a is closed to stop the supply of the $O_2$ gas into the process chamber 201. Thus, the plasma processing step S140 is completed.

By such a process, the thickness of the oxide film formed on the bottom portion 301a of the trench 301 and the thickness of the oxide film formed on the side portion 301b of the trench 301 can be made close to each other. That is to say, it is possible to form the films with good step coverage. The reasons will be described in detail below.

(Wave Evacuation Step S150)

If the supply of the $O_2$ gas is stopped after a predetermined processing time elapses, the interior of the process chamber 201 is evacuated using the exhaust pipe 231. As a result, the mixed gas in the process chamber 201, the exhaust gas produced by the reaction of the mixed gas, and the like are exhausted to the outside of the process chamber 201. Thereafter, by adjusting the opening degree of the APC valve 242, the internal pressure of the process chamber 201 is adjusted to the same pressure (for example, 100 Pa) as the internal pressure of the vacuum transfer chamber (the unloading destination of the wafer 200) (not shown) adjacent to the process chamber 201.

(Substrate Unloading Step S160)

When the internal pressure of the process chamber 201 reaches a predetermined pressure, the susceptor 217 is lowered to the transfer position of the wafer 200, thereby allowing the wafer 200 to be supported on the wafer push-up pins 266. Then, the gate valve 244 is opened, and the wafer 200 is unloaded to the outside of the process chamber 201 using a transfer mechanism not shown in the figure. At this time, the unloading of the wafer 200 may be performed while purging the inside of the process chamber 201 with an inert gas or the like. Thus, the substrate processing process according to the present embodiment is completed.

<Comparison with Comparative Example>

Figure 6:
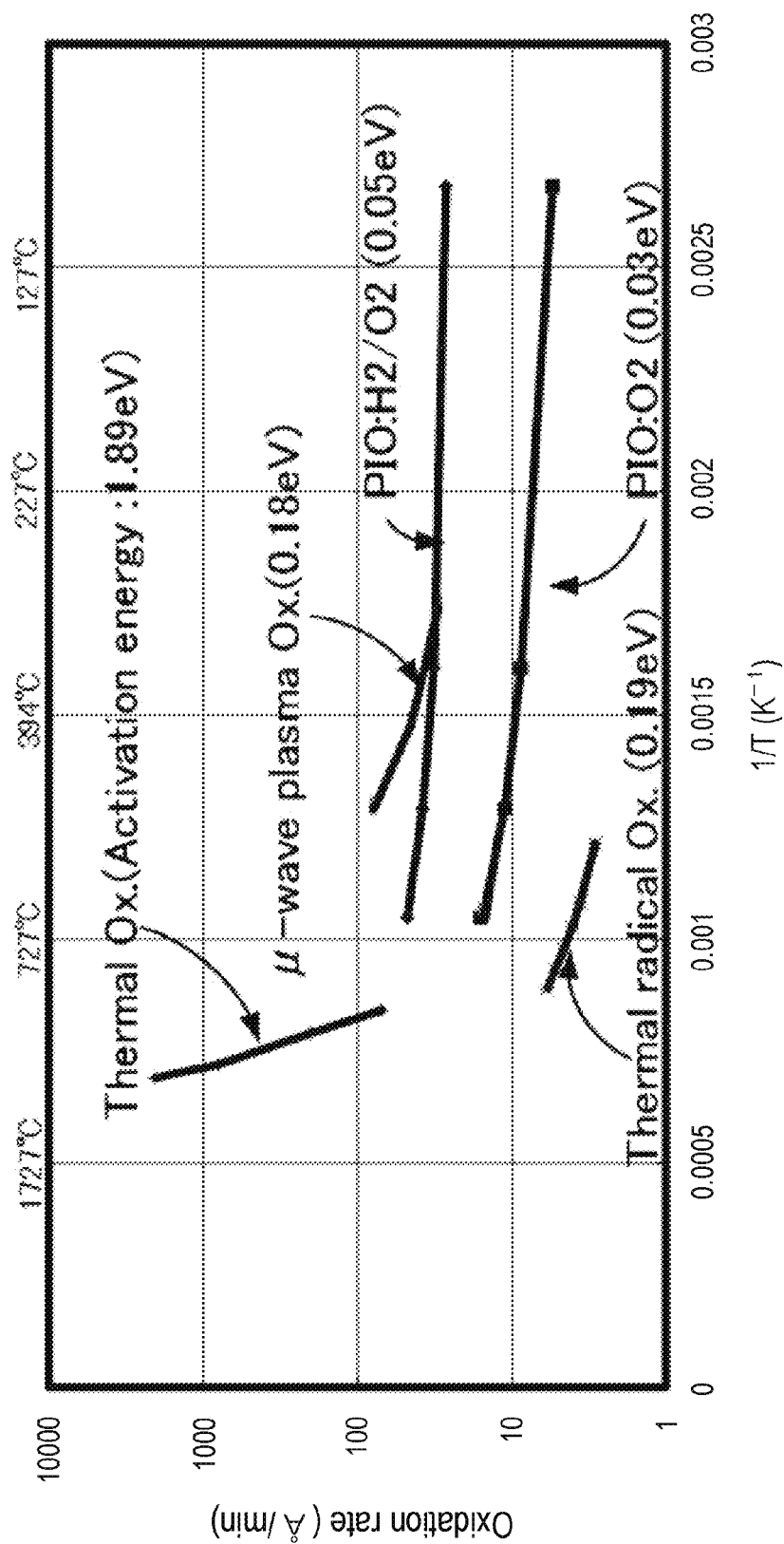
FIG. 6 is an explanatory diagram comparing the temperature dependency of oxidation rate in a substrate processing process according to an embodiment of the present disclosure and a substrate processing process according to a comparative example.

FIG. 6 is an explanatory diagram comparing the temperature dependency of the oxidation rate in the substrate processing process according to the embodiment of the present disclosure and the substrate processing process according to a comparative example. In FIG. 6, the vertical axis represents the oxidation rate (in this example, the oxidation rate of a silicon film), and the horizontal axis represents the treatment temperature. From the slope of this graph, it is possible to find the activation energy in the oxidation reaction of each substrate processing process.

In FIG. 6, "Thermal Ox" indicates a case where oxidation is performed by oxygen and heat. "μ-wave plasma Ox" indicates a case where a mixture of oxygen and hydrogen is plasma-excited with microwaves and oxidation is performed by the excited plasma. "Thermal radical Ox" indicates a case where oxidation is performed by a radical generated by thermal excitation of oxygen. "PIO: $O_2$" indicates a case where an $O_2$ gas is plasma-excited by the plasma generation mechanism according to the present disclosure. "PIO: $H_2/O_2$" indicates a case where a mixed gas of an $O_2$ gas and a $H_2$ gas is plasma-excited by the plasma generation mechanism according to the present disclosure. As shown in FIG. 6, the values of activation energy in the respective cases are as follows: Thermal Ox: 1.89 eV, μ-wave plasma Ox: 0.18 eV, Thermal radical Ox: 0.19 eV, PIO: $O_2$ (present disclosure 1): 0.03 eV, and PIO: $H_2/O_2$ (present disclosure 2): 0.05 eV.

In the case where the activation energy is high (namely the case where the gradient of the graph in FIG. 6 is large), a larger amount of energy is required to cause a reaction and the contribution of heat in the oxidation reaction is large. Therefore, there is a tendency that a large difference in the oxidation rate is generated due to the difference in the magnitudes of bonding energy of oxidation target films. More specifically, the magnitude of bonding energy varies when the types of films are different or when the same type of film has different crystal orientations. Accordingly, when the activation energy in the oxidation treatment process is high and when the types and crystal orientations of oxidation target films are different (the magnitudes of bonding energy are different) the ease of oxidation greatly varies. On the other hand, when the activation energy is low (namely when the gradient of the graph in FIG. 6 is small: 0.05 eV or less), the contribution of heat in the oxidation reaction is small and the difference in the types or crystal orientations of oxidation target films hardly affects the oxidation rate. More specifically, for example, even when the magnitudes of the bonding energy of oxidation target films are different, the ease of oxidation hardly depends on the magnitude of bonding energy, and the difference in oxidation rate hardly occurs, because the activation energy is low. As described above, even in the case of oxidizing plural types of silicon-containing films having different magnitudes of bonding energy or silicon-containing films having different crystal orientations, a difference in oxidation rate is less likely to occur in the treatment method of the present disclosure.

Figure 7A:
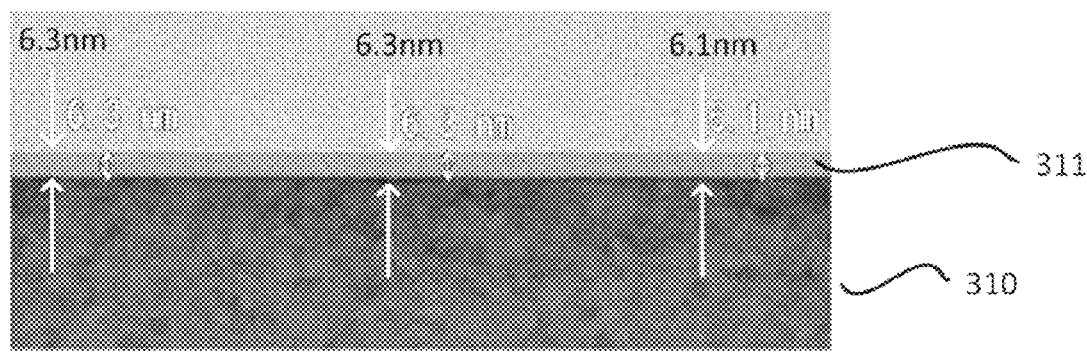
FIG. 7A is a diagram showing a result of performing a modification process (film formation process) using c-Si as a base in the first embodiment of the present disclosure.
Figure 7B:
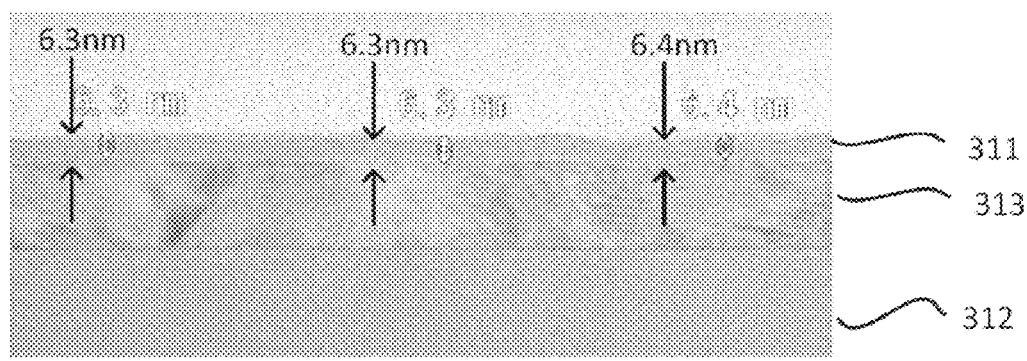
FIG. 7B is a diagram showing a result of performing a modification process (film formation process) using poly-Si as a base in the first embodiment of the present disclosure.

FIGS. 7A and 7B show the results of film formation in the case of oxidizing (modifying) c-Si and Poly-Si as bases in the embodiment of the present disclosure described above. FIG. 7A shows an example in which an oxide film 311 is formed by oxidizing c-Si 310 which is a base. In this example, the film was formed at an average thickness of 6.2 nm. FIG. 7B shows an example in which an oxide film 311 is formed by oxidizing Poly-Si 313 as a base on a silicon oxide layer 312 in the embodiment of the present disclosure described above. In this example, the film was formed at an average thickness of 6.3 nm. From these results, it can be confirmed that according to the present disclosure, it is possible to form an oxide film having substantially the same thickness for both c-Si and Poly-Si used as a base.

Figure 8A:
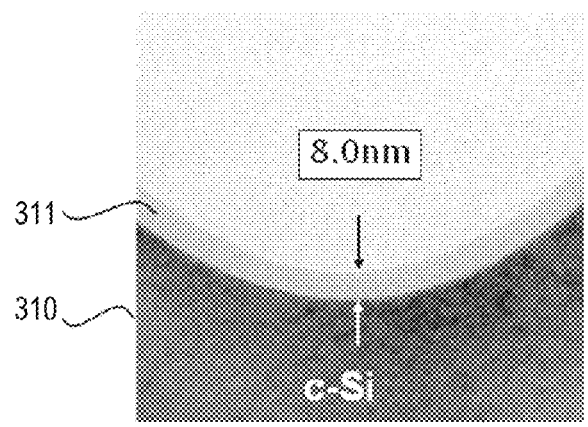
FIG. 8A is a diagram showing a result of performing a modification process (film formation process) using c-Si as a base in the first embodiment of the present disclosure.
Figure 8B:
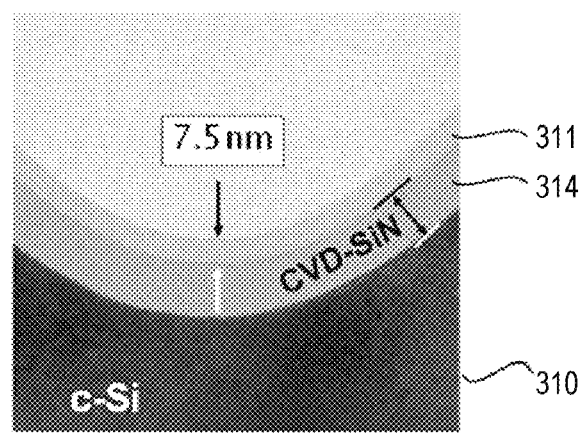
FIG. 8B is a diagram showing a result of performing a modification process (film formation process) using silicon nitride as a base in the first embodiment of the present disclosure.

FIGS. 8A and 8B show the results of film formation in the case where c-Si and silicon nitride as bases are oxidized in the embodiment of the present disclosure described above. FIG. 8A shows an example in which an oxide film 311 is formed by oxidizing c-Si 310 as a base. In this example, the film was formed at an average thickness of 8.0 nm. FIG. 8B shows an example in which an oxide film 311 is formed by oxidizing a silicon nitride film 314 stacked as a base on c-Si 310. In this example, the film was formed at an average thickness of 7.5 nm. From these results, it can be confirmed that according to the present disclosure, it is possible to form an oxide film having substantially the same thickness for both c-Si and silicon nitride used as a base. The expression "substantially the same thickness" used herein has a deviation range of, for example, about ±0.5 nm (about ±10%).

Figure 9:
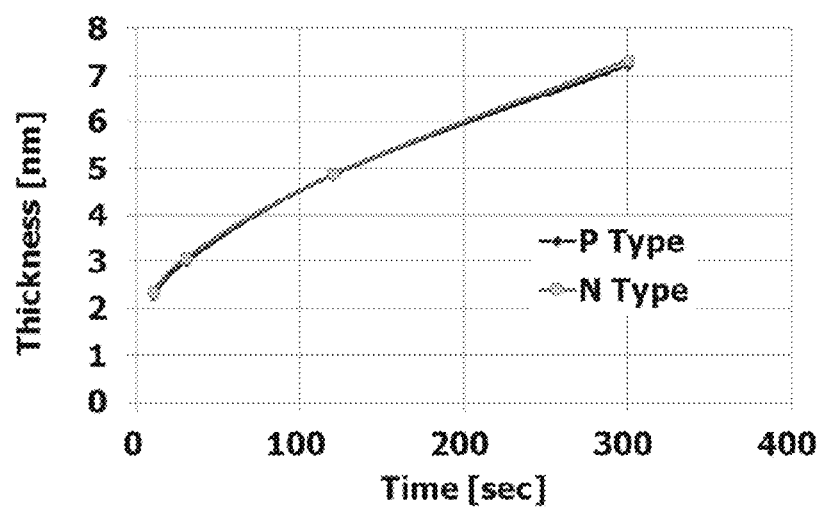
FIG. 9 is a diagram showing a result of performing a modification process (film formation process) using a P-type doped silicon substrate and an N-type doped silicon substrate as a base in the first embodiment of the present disclosure.

FIG. 9 shows the results of film formation (time dependency) in the case where a P-type doped silicon (B-dope c-Si) substrate and an N-type doped silicon (p-dope c-Si) substrate as bases are oxidized in the embodiment of the present disclosure described above. From these results, it can be confirmed that according to the present disclosure, the deposition rate remains almost the same for both the P-type doped silicon substrate and the N-type doped silicon substrate used as a base.

Figure 10:
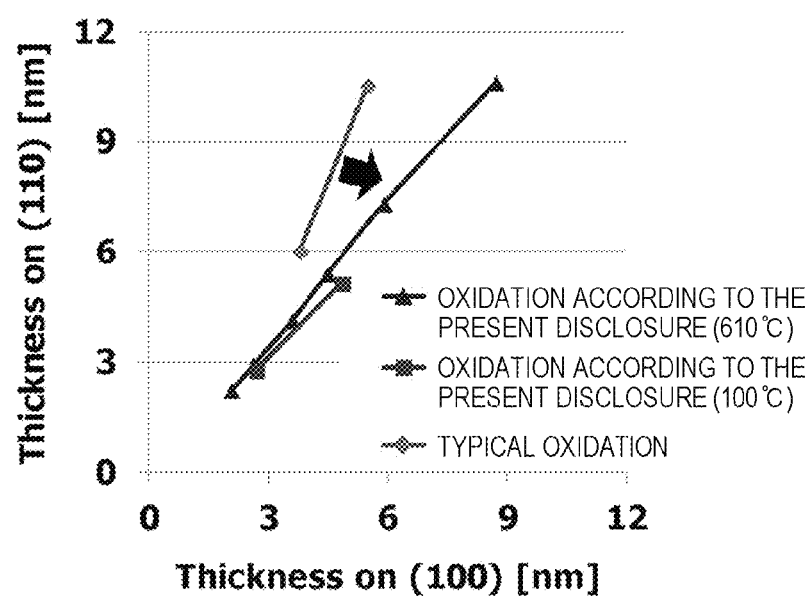
FIG. 10 is a diagram showing a result of performing a modification process (film formation process) using substrates with different c-Si crystal orientations as a base in the first embodiment of the present disclosure.

FIG. 10 shows the results of film formation (film thickness comparison graphs) in the case where substrates having different c-Si crystal orientations (100) and (110) as bases are oxidized in the embodiment of the present disclosure described above. The comparison is made for the typical thermal oxidation and the oxidation method of the present disclosure under different temperature conditions. It can be confirmed that the oxidation rate for the crystal orientation (110) is higher than the oxidation rate for the crystal orientation (100) in the typical thermal oxidation, whereas the deposition rate remains almost the same in the oxidation according to the present disclosure. In addition, it can also be confirmed that when the temperature is lowered (to 100 degrees C.) in the present disclosure, the difference in the deposition rate is further reduced (improved).

In the above-described embodiment, the $O_2$ gas is used as the process gas (reaction gas). Alternatively, the process gas used may be a mixed gas of an $O_2$ gas and a $H_2$ gas, in which case the ratio of gases may be set so that the $H_2$ gas is in a range of 1% to 95%. From the viewpoint of the growth rate and uniformity of the oxide film, the ratio of the $H_2$ gas may be in a range of 3% to 7%.

However, when a film containing a metal is formed on a substrate and when the metal film must not be oxidized, the ratio of the $H_2$ gas may be in a range of 50% to 80%. By setting the ratio of the $H_2$ gas to 50% or more, it is possible to oxidize a silicon-containing film while more reliably suppressing oxidation of the metal film. When the ratio of the $H_2$ gas exceeds 80%, the oxidation rate of the silicon-containing film sometimes falls below a practical rate although it may be possible to suppress oxidation of the metal film. Therefore, it is preferred that the ratio of the $H_2$ gas is 80% or less. In this case, the internal pressure of the process chamber 201 may be in a range of 50 Pa to 300 Pa, preferably 100 Pa to 200 Pa. If the internal pressure falls below 50 Pa, the oxidation rate decreases. Thus, there is a possibility that a practical rate cannot be obtained. If the internal pressure exceeds 300 Pa, there is a possibility that plasma is not generated.

In addition, a rare Ras such as Ar or He may be mixed with the process gas. The input RF power is 5.0 kW or less (preferably 4.0 kW or less) and may preferably be in a range of 1.0 kW or more in order to stably generate plasma.

The base film and the substrate are to be oxidized through diffusion and, therefore, must contain silicon, Specifically, the silicon may be c-Si, c-Si doped with phosphine, c-Si doped with boron, c-Si having a crystal orientation (110) or (111) as well as an ordinary crystal orientation (100), Poly-Si, amorphous silicon, silicon nitride, silicon oxide, or the like. Even in the nitriding or the annealing not accompanied by film formation as well as the oxidation, it is possible to expect the same effect of eliminating the dependency on the base.

From the foregoing, it can be noted that the plasma oxidation method according to the present embodiment does not depend on the base and can obtain good step coverage for different types of silicon-containing films and for silicon-containing films having different crystal orientations.

(3) Effects According to the Present Embodiment

According to the present embodiment, one or more effects set forth below may be achieved.

(a) According to the present embodiment, even when the substrate to be processed exposes the surfaces of at least plural types of silicon-containing films and even when at least one of the silicon-containing films exposes a plurality of crystal orientation surfaces different from each other, the surfaces of the plurality of exposed silicon-containing films and the surfaces of the silicon-containing films having a plurality of crystal orientations can be modified (oxidized) to have a uniform thickness regardless of the difference in crystal orientation by using the plasma processing apparatus of the present disclosure.

(b) In addition, according to the present embodiment, by generating plasma with the inductive coupling structure of the present embodiment, it is possible to modify the silicon-containing films with very low activation energy of 0.05 eV or less, which is not realized by other plasma generation methods. Even for the silicon-containing films of different types or the silicon-containing films having different crystal orientations, it is possible to perform modification at the same rate regardless of the difference thereof. In particular, even for the silicon-containing films differing in bonding energy, it is possible to perform modification at the same rate regardless of the magnitude of bonding energy.

(c) According to the present embodiment, as in the processing target structure shown in FIG. 5, even when the surfaces of plural types of silicon-containing films are exposed in the trench and even when at least one of the silicon-containing films exposes a plurality of mutually different crystal orientation surfaces, the oxide films in the side portion of the trench, the bottom portion of the trench and the boundary portion of the trench are modified (oxidized) at the same rate. Thus, the variation in the thickness of the oxide films in the trench is reduced. In addition, it is possible to obtain good step coverage with respect to the oxide films. Accordingly, it is possible to make the characteristics of a semiconductor device uniform and to reduce variations in performance.

(d) Since the power supply control part attached to the high-frequency power supply 273 compensates for the reflected wave power due to the impedance mismatch generated in the resonance coil 212 on the side of the high-frequency power supply 273 and compensates for the reduction in effective lead power, it is possible to reliably supply the high frequency power of an initial level to the resonance coil 212 at all times and to stabilize the plasma. Accordingly, the surface of the wafer held in the substrate processing space, particularly the surface in the trench as in the present embodiment, can be uniformly processed at a constant rate.

The present embodiment has been described using patterns in which the trench 301 of a high aspect ratio having uneven portions is formed as shown in FIG. 5. As an example of modifying (oxidizing) a film having these patterns, for example, in one of processes for manufacturing a three-dimensionally stacked flash memory, the oxidation process of the present disclosure may be performed with respect to a pattern in which a floating electrode made of polysilicon is formed in die upper portion of a trench. As a result, it is possible to form a silicon oxide layer on a floating electrode.

As a structure in which the trenches 301 of a high aspect ratio having uneven portions are formed as shown in FIG. 5, for example, a pattern structure in which different device structures are adjacent to each other is conceivable. In this case, a dense pattern may exist due to the difference in the width and interval of the trenches 301.

Although such a fine pattern may be treated with a conventional CVD apparatus, it is assumed that the in-plane film thickness varies due to the dense pattern.

On the other hand, in the substrate processing method according to the embodiment of the present disclosure, oxygen radicals and ions in a non-accelerated state are gently and uniformly supplied into the trench 301. Thus, substrate processing can be uniformly performed regardless of the pattern density. In other words, an oxide film with high step coverage can be formed regardless of the pattern density. Since ion attack due to acceleration can be prevented, it is possible to suppress wafer damage which may be caused by ions.

Second Embodiment

Subsequently, a second embodiment will be described with reference to FIGS. 11 and 12. The second embodiment is different from the first embodiment in terms of the following points. First, the pattern structure formed on the wafer to be processed in the substrate processing process is different. Second, in the processing method, steps S130 and S140 shown in FIG. 4 in the first embodiment are different. Steps S110, S120, S150 and S160 are the same as those of the first embodiment. As the substrate processing apparatus, the same apparatus as in the first embodiment is used.

Figure 11:
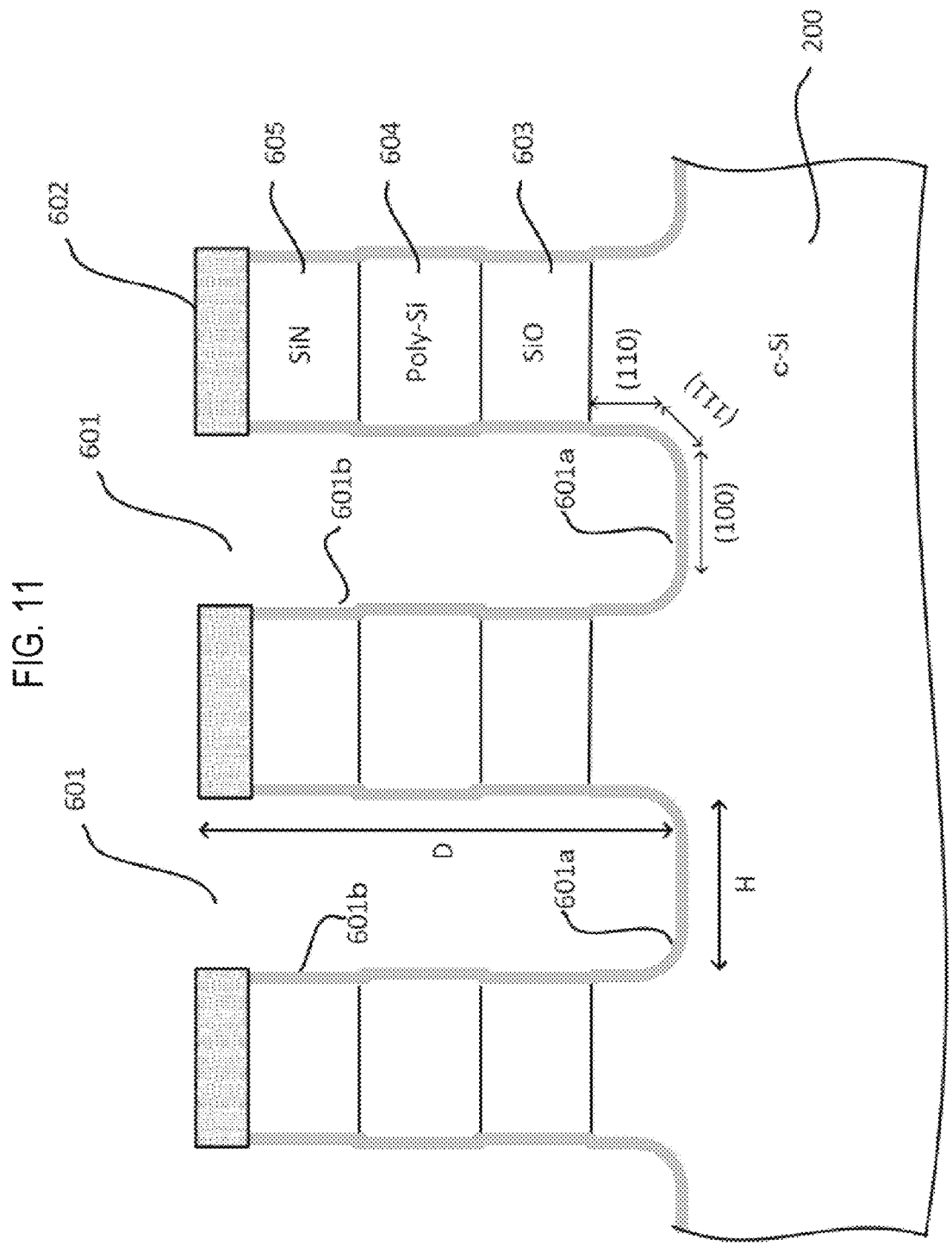
FIG. 11 is a diagram illustrating a pattern structure of a substrate processed in a substrate processing process according to a second embodiment of the present disclosure.

FIG. 11 is a diagram for explaining the pattern structure processed in the substrate processing process according to the second embodiment. The pattern shown in FIG. 11 differs from the device structure of FIG. 5 according to the first embodiment in that a control electrode 602 composed of a metal-containing film is formed.

Hereinafter, the substrate processing method according to the present embodiment will be specifically described.

(1) Substrate Processing Process

The substrate processing process according to the present embodiment will be described. The substrate processing process according to the present embodiment is performed by the substrate processing apparatus 100 described above. In the following description, the operations of the respective parts constituting the substrate processing apparatus 100 are controlled by the controller 221.

On the surface of the wafer 200 processed in the substrate processing process according to the present embodiment, a trench 601 of a high aspect ratio having uneven portions (grooves) is formed in advance as in the first embodiment. In the trench 601 before the substrate processing process is performed, a control electrode 602 composed of a metal-containing film and plural types of silicon-containing films different from each other are exposed. In the vicinity of the bottom surface of the trench, silicon containing films having mutually different crystal orientations are exposed.

More specifically, on the wafer 200 to be processed in the present embodiment, different types of silicon-containing films such as, for example, a silicon oxide film 603, a Poly-Si film 604 and a silicon nitride film 605, and a control electrode 602 as a metal-containing film are stacked on c-Si. In the vicinity of a boundary portion between a bottom portion 601a and a side portion 601b of the trench 601 of the c-Si film, c-Si films having mutually different crystal orientations are exposed. In this example, the crystal orientation of the bottom portion 601a is (100), the crystal orientation of the boundary portion is (111), and the crystal orientation of the side portion 601b is (110). This laminated structure is formed by etching such as dry etching or the like.

In the present embodiment, the surfaces of the silicon-containing films exposed on the inner wall (the side portion, the bottom portion and the boundary portion thereof) of the trench 601 are oxidized. However, when this pattern structure is exposed to an oxygen atmosphere in order to oxidize the surfaces of the silicon-containing films in the trench 601, the control electrode 602, which is a metal-containing film, is also exposed to the oxygen atmosphere. Thus, the control electrode 602 may be oxidized and deteriorated. In view of this, in the present embodiment, only the surfaces of the silicon-containing films are selectively oxidized so that the control electrode 602 as a metal-containing film is not oxidized.

Figure 4:
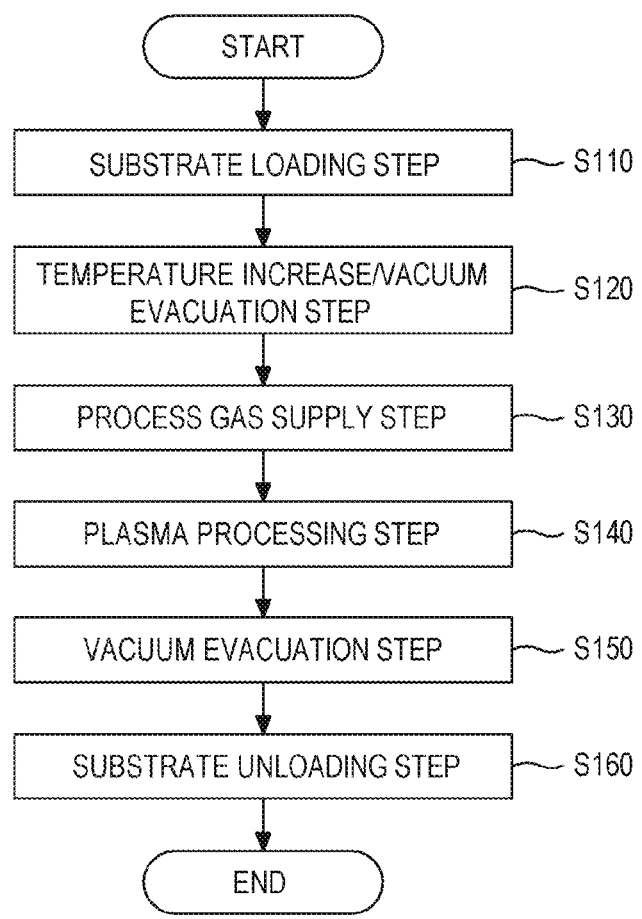
FIG. 4 is a flowchart showing a substrate processing process according to a first embodiment of the present disclosure.

The present embodiment is similar to the contents of FIG. 4 showing the substrate processing process of the first embodiment in terms of the following points. That is to say, step S210 is similar to step S110, step S220 is similar to step S120, step S240 is similar to S150, and step S250 is similar to step S160. Thus, descriptions will be simplified for the similar parts. The substrate processing process according to the present embodiment will be described in detail below.

(Substrate Loading Step S210)

As in step S110, the wafer 200 on which the trench 601 is formed is loaded into the process chamber 201 and is mounted on the upper surface of the susceptor 217.

(Temperature Increase/Vacuum Evacuation Step S220)

Subsequently, as in step S120, the temperature of the wafer 200 loaded into the process chamber 201 is increased. While increasing the temperature of the wafer 200, the interior of the process chamber 201 is evacuated and the internal pressure of the process chamber 201 is regulated to a predetermined value.

(Reaction Gas Supply and Plasma Processing Step S230)

Next, the supply of an $O_2$ gas and a $H_2$ gas as reaction gases and the supply of an Ar gas as an addition gas are started. Details are as follows.

(Mixed Gas Flow Rate Control Step)

The valves 243a, 253a, 253b and 253c are opened to introduce (supply) a mixed gas of an $O_2$ gas, a $H_2$ gas and an Ar gas into the process chamber 201 through the buffer chamber 237. Specifically, the valve 253a is opened and the supply of the $O_2$ gas into the process chamber 201 via the buffer chamber 237 is started while controlling the flow rate thereof by the MFC 252a. At the same time, the valve 253b is opened and the supply of the $H_2$ gas into the process chamber 201 via the buffer chamber 237 is started while controlling the flow rate thereof by the MFC 252b. Furthermore, the supply of the Ar gas from the Ar gas supply source 250c to the buffer chamber 237 via the MFC 252c, the valve 253c and the gas supply pipe 232c is started. At this time, the volume ratio of the $H_2$ gas in the mixed gas of the $O_2$ gas and the $H_2$ gas is set to fall within a range of 50% to 80% (in the present embodiment, 50% or more).

Furthermore, the interior of the process chamber 201 is evacuated by adjusting the opening degree of the APC valve 242 so that the internal pressure of the process chamber 201 becomes a predetermined pressure which falls within a range of, for example, 50 Pa to 300 Pa, more preferably 100 Pa to 200 Pa (in the present embodiment, 120 Pa). While appropriately evacuating the interior of the process chamber 201 in this way, the supply of the mixed gas of the $O_2$ gas, the $H_2$ gas and the Ar gas is continued until the end of the plasma processing step to be described later.

Before supplying the mixed gas, the $H_2$ gas may be introduced into the process chamber 201 to adjust the internal pressure of the process chamber 201 to a predetermined pressure. By doing so, at the start of supply of the mixed gas, it is possible to suppress rapid oxidation of the control electrode 602 while maintaining the internal pressure of the process chamber 201.

(Plasma Excitation Start Step)

After a lapse of a predetermined time (for example, after a lapse of several seconds) from the start of introduction of the mixed gas, the application of the high frequency power from the high-frequency power supply 273 to the resonance coil 212 via the RF sensor 272 is started. As a result, an inductive magnetic field is formed in the plasma generation space 201a. By such an inductive magnetic field, doughnut-shaped inductive plasma is excited in a height position corresponding to the electric midpoint of the resonance coil 212 in the plasma generation space. The $O_2$ gas and the $H_2$ gas are activated and dissociated by the excited plasma, thereby generating reactive species (for example, OH and H, etc.) such as oxygen active species containing oxygen (O) and hydrogen (H), oxygen ions, hydrogen active species, hydrogen ions and the like. At this time, the rare gas (Ar gas) added contributes to the stabilization of the plasma discharge.

As described above, the standing wave having a state in which a phase voltage and an opposite phase voltage are always canceled out is formed. The highest phase current is generated at the electric midpoint of the coil (at the node having zero voltage). Accordingly, the inductive plasma excited at the electric midpoint has almost no capacitive coupling with the wall of the process chamber or the substrate mounting table. Doughnut-shaped plasma with extremely low electric potential can be formed in the plasma generation space 201a.

Furthermore, as described above, the power supply control part attached to the high-frequency power supply 273 compensates for the deviation of the resonance point in the resonance coil 212 due to the fluctuation of the capacitive coupling or inductive coupling of the plasma, thereby more accurately forming the standing wave. Thus, there is almost no capacitive coupling. This makes it possible to more accurately form the plasma with extremely low electric potential in the plasma generation space.

Therefore, oxygen radicals and ions in a non-accelerated state are uniformly supplied to the trench 601 in the wafer 200 held on the substrate mounting table 217 in the substrate processing space 201b. The radicals and ions thus supplied uniformly react with the bottom portion 601a, the side portion 601b and the boundary portion thereof, thereby modifying the exposed surfaces of the silicon-containing films into an oxide film with high step coverage. Furthermore, ion attack due to acceleration can be prevented. This makes it possible suppress wafer damage which may be caused by ions.

Inasmuch as the acceleration of ions is prevented, there is no sputtering action on the peripheral wall of the plasma generation space and there is no damage to the peripheral wall of the plasma generation space. As a result, it is possible to prolong the lifespan of the apparatus. It is also possible to prevent a problem that the member component of the plasma generation space or the like enters the plasma and contaminates the wafer.

(Plasma Processing Step (Selective Oxidation Step))

The mixed gas activated by the plasma is supplied to the wafer 200 having the trench 601, namely the structure in which the c-Si film, the silicon oxide film 603, the poly-Si film 604, the silicon nitride film 605 and the control electrode 602 are exposed, thereby subjecting the wafer W to plasma processing (selective oxidation).

Specifically, when the mixed gas containing the $H_2$ gas, the $O_2$ gas and the rare gas (Ar gas) is activated by plasma, H, OH and the like are generated. The OH acts on the surfaces of the silicon-containing films on the wafer 200 and oxidizes the surfaces of the silicon-containing films, thereby forming an oxide film. The H has a relatively small reducibility with respect to the surfaces of the silicon-containing films.

That is to say, when the OH acts on the surfaces of the silicon-containing films on the wafer 200, a new oxide film is formed on the surfaces of the silicon-containing films (the c-Si film, the silicon oxide film 603, the Poly-Si film 604 and the silicon nitride film 605).

Generally, the OH has an oxidizing property with respect to the surface of the metal-containing film on the wafer 200, and the H has a reducing property with respect to the surface of the metal-containing film. For example, when the OH concentration is relatively high (the H concentration is relatively low), the surface of the metal-containing film on the wafer 200 is oxidized. That is to say, in this case, the oxidizing action by the OH is greater than the reducing action by the H. On the other hand, when the OH concentration is relatively low (the H concentration is relatively high), the surface of the metal-containing film on the wafer 200 is not oxidized (but is reduced). That is to say, in this case, the reducing action by the H is greater than the oxidizing action by the OH.

In the present embodiment, the opening degrees of the MFCs 252a, 252b and 252c are adjusted so that the flow rate of the $H_2$ gas with respect to the total sum of the flow rates of the $O_2$ gas and the $H_2$ gas in the mixed gas is controlled to become 50% or more. The plasma processing is performed on the wafer 200 using the mixed gas turned into plasma. Therefore, in the metal-containing region on the wafer 200, the reducing action by the H is greater than the oxidizing action by OH. Thus, the oxidation of the surface of the metal-containing region on the wafer 200 is suppressed (Even if the surface of the metal-containing region is oxidized, it is reduced).

Thereafter, when a predetermined processing time of, for example, 10 seconds to 300 seconds elapses, the output of electric power from the high-frequency power supply 273 is stopped to thereby stop the plasma discharge in the process chamber 201. Furthermore, the valves 253a, 253b and 253c are closed to stop the supply of the $O_2$ gas, the $H_2$ gas and the Ar gas into the process chamber 201. Thus, the plasma processing step is completed.

(Vacuum Evacuation Step S240)

When the supply of the $O_2$ gas, the $H_2$ gas and the Ar gas is stopped after a predetermined processing time elapses, the interior of the process chamber 201 is evacuated using the exhaust pipe 231. Thus, the $O_2$ gas, the $H_2$ gas, the Ar gas, the exhaust gas produced by the reaction of the $O_2$ gas, and the like, which exist in the process chamber 201, are exhausted to the outside of the process chamber 201. Thereafter, by adjusting the opening degree of the APC valve 242, the internal pressure of the process chamber 201 is adjusted to the same pressure (for example, 100 Pa) as the internal pressure of the vacuum transfer chamber (the unloading destination of the wafer 200) (not shown) adjacent to the process chamber 201.

(Substrate Unloading Step S250)

When the internal pressure of the process chamber 201 reaches a predetermined pressure, as in step S160, the gate valve 244 is opened and the wafer 200 is unloaded from the process chamber 201. Thus, the substrate processing process according to the present embodiment is completed.

According to the present embodiment, without oxidizing the control electrode 602 formed of the metal-containing film and exposed on the wafer 200, it is possible to selectively oxidize the surfaces of the silicon-containing films in the trench 601 and to form an oxide film on the bottom portion 601a of the trench 601, the side portion 601b of the trench 601 and the boundary portion between the bottom portion 601a and the side portion 601b. In addition, it is possible to modify (oxidize) the silicon-containing films with a uniform thickness regardless of the difference in the type and crystal orientation of the silicon-containing films exposed in the trench 601.

The present disclosure may be applied not only to oxidation but also to oxynitriding which performs oxidation and nitriding at the same time, diffusion, film formation (film deposition), etching and the like. For example, in the oxynitriding, an oxygen-containing gas such as an $O_2$ gas or the like, or a mixed gas obtained by adding a nitrogen-containing gas, a hydrogen-containing gas such as a $H_2$ gas or the like or a rare gas to an oxygen-containing gas is used. In the film formation, silicon-containing gas such as a monosilane ($SiH_4$) gas or a disilane ($Si_2H_6$) gas is used in combination with an oxygen-containing gas, a nitrogen-containing gas or the like. In this way, the reaction gas to be used may be appropriately selected according to the contents of the respective processes.

According to the present disclosure in some embodiments, it is possible to provide a technique capable of forming a modified film under a condition of good coverage and film quality without depending on a base of a substrate to be subjected a modification process and capable of improving the characteristics and productivity of a semiconductor device.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
supplying a process gas to the substrate, wherein the substrate has a trench structure on a surface of the substrate and includes a monocrystalline silicon base and a plurality of silicon-containing films, the plurality of silicon-containing films includes a first silicon oxide film not containing nitrogen, a silicon nitride film not containing oxygen, and a second silicon oxide film not containing nitrogen that are sequentially stacked on the monocrystalline silicon base, the first silicon oxide film not containing nitrogen is stacked directly on the monocrystalline silicon base, the monocrystalline silicon base, the first silicon oxide film, the silicon nitride film and the second silicon oxide film respectively have surfaces that are exposed in the trench structure, the monocrystalline silicon base includes a plurality of portions whose crystal orientations are different from each other and which are exposed in a bottom surface of the trench structure;
starting generation of plasma of the process gas; and
modifying the surfaces of the monocrystalline silicon base and the silicon nitride film exposed in the trench structure of the substrate, respectively, into oxide films by the plasma,
wherein the monocrystalline silicon base and the silicon nitride film are different from each other in magnitude of bonding energy,
wherein the plurality of portions included in the monocrystalline silicon base are different from each other in magnitude of bonding energy, and
wherein the process gas is a mixed gas of an oxygen gas and a hydrogen gas, and a volume ratio of the hydrogen gas in the process gas is 3% or more and 7% or less.

2. The method of claim 1, further comprising:
after the generation of the plasma of the process gas is started, controlling a frequency of a high frequency power to maintain a resonance state.

3. The method of claim 1, wherein modifying the surfaces of the monocrystalline silicon base and the silicon nitride film further comprises modifying the surfaces of the silicon nitride film, which are exposed in the trench structure of the substrate, and the surfaces of the plurality of portions of the monocrystalline silicon base, whose crystal orientations are different from each other and which are exposed in the trench structure of the substrate, at the same thickness.

4. The method of claim 1, wherein the starting the generation of the plasma of the process gas comprises applying high frequency power of 1.0 kW or more.

5. The method of claim 1, wherein modifying the surfaces of the monocrystalline silicon base and the silicon nitride film further comprises oxidizing the surfaces of the monocrystalline silicon base and the silicon nitride film exposed in the trench structure.

6. The method of claim 1, wherein the trench structure includes a trench whose aspect ratio is about 20.

7. The method of claim 1, wherein the surfaces of the plurality of silicon-containing films are exposed in different positions in a depth direction of the trench structure inside the trench structure.

8. The method of claim 1, wherein modifying the surfaces of the monocrystalline silicon base and the silicon nitride film further comprises setting a process pressure to fall within a range of 100 Pa or more and 200 Pa or less.

9. The method of claim 1, wherein the plurality of silicon-containing films further includes a polysilicon film.

10. The method of claim 1, wherein the plurality of portions included in the monocrystalline silicon base have crystal orientations of (100), (111) and (110), respectively.

11. The method of claim 1, wherein a deviation of thickness of the oxide films formed by modifying the surfaces of the monocrystalline silicon base and the silicon nitride film falls within a range of +10%.

12. A method of manufacturing a semiconductor device, comprising the method of claim 1.

13. A method of forming a semiconductor device, comprising:
   forming a first silicon oxide layer not containing nitrogen, a silicon nitride layer not containing oxygen, and a second silicon oxide layer not containing nitrogen that are sequentially stacked on a monocrystalline silicon base of a substrate, the second silicon oxide layer not containing nitrogen being provided on the silicon nitride layer not containing oxygen, the silicon nitride layer not containing oxygen being provided on the first silicon oxide layer not containing nitrogen, the first silicon oxide layer not containing nitrogen being provided directly on the monocrystalline silicon base;
   selectively removing the second silicon oxide layer not containing nitrogen, the silicon nitride layer not containing oxygen, the first silicon oxide layer not containing nitrogen, and the monocrystalline silicon base of the substrate to form a trench which includes a recess in the substrate and respectively exposes side surfaces of the first silicon oxide layer not containing nitrogen, the silicon nitride layer not containing oxygen, and the second silicon oxide layer not containing nitrogen and a surface of the monocrystalline silicon base including a plurality of portions whose crystal orientations are different from each other in a bottom surface of the recess; and
   supplying a plasma gas which is obtained by exciting a process gas to the trench to modify the exposed side surfaces of the silicon nitride layer not containing oxygen and the exposed surface of the monocrystalline silicon base, respectively, into oxide layers, so that the oxidized side surfaces of the silicon nitride layer not containing oxygen and the oxidized surface of the monocrystalline silicon base has substantially the same thickness to one another, and
   wherein the monocrystalline silicon base and the silicon nitride layer are different from each other in magnitude of bonding energy,
   wherein the plurality of portions included in the monocrystalline silicon base are different from each other in magnitude of bonding energy, and
   wherein the process gas is a mixed gas of an oxygen gas and a hydrogen gas, and a volume ratio of the hydrogen gas in the process gas is 3% or more and 7% or less.

14. A method of processing a substrate, comprising:
   forming a first silicon oxide layer not containing nitrogen, a silicon nitride layer not containing oxygen, and a second silicon oxide layer not containing nitrogen that are sequentially stacked on a monocrystalline silicon base of the substrate, the second silicon oxide layer not containing nitrogen being provided on the silicon nitride layer not containing oxygen, the silicon nitride layer not containing oxygen being provided on the first silicon oxide layer not containing nitrogen, the first silicon oxide layer not containing nitrogen being provided directly on the monocrystalline silicon base;
   selectively removing the second silicon oxide layer not containing nitrogen, the silicon nitride layer not containing oxygen, the first silicon oxide layer not containing nitrogen, and the monocrystalline silicon base of the substrate to form a trench which includes a recess in the substrate and respectively exposes side surfaces of the first silicon oxide layer not containing nitrogen, the silicon nitride layer not containing oxygen, and the second silicon oxide layer not containing nitrogen and a surface of the monocrystalline silicon base including a plurality of portions whose crystal orientations are different from each other in a bottom surface of the recess; and
   supplying a plasma gas which is obtained by exciting a process gas to the trench to modify the exposed side surfaces of the silicon nitride layer not containing oxygen and the exposed surface of the monocrystalline silicon base, respectively, into oxide films, so that the oxidized side surfaces of the silicon nitride layer not containing oxygen and the oxidized surface of the monocrystalline silicon base has substantially the same thickness to one another, and
   wherein the monocrystalline silicon base and the silicon nitride film are different from each other in magnitude of bonding energy,
   wherein the plurality of portions included in the monocrystalline silicon base are different from each other in magnitude of bonding energy, and
   wherein the process gas is a mixed gas of an oxygen gas and a hydrogen gas, and a volume ratio of the hydrogen gas in the process gas is 3% or more and 7% or less.

* * * * *